US010636476B2

(12) United States Patent
Nale

(10) Patent No.: US 10,636,476 B2
(45) Date of Patent: Apr. 28, 2020

(54) ROW HAMMER MITIGATION WITH RANDOMIZATION OF TARGET ROW SELECTION

(71) Applicant: Intel Corporation, Santa Clara, CA (US)

(72) Inventor: Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/178,473

(22) Filed: Nov. 1, 2018

(65) Prior Publication Data

US 2019/0066759 A1 Feb. 28, 2019

(51) Int. Cl.
| G11C 16/04 | (2006.01) |
| G11C 11/4078 | (2006.01) |
| G06F 12/02 | (2006.01) |
| G11C 11/406 | (2006.01) |
| G11C 11/408 | (2006.01) |

(52) U.S. Cl.
CPC ...... G11C 11/4078 (2013.01); G06F 12/0207 (2013.01); G11C 11/408 (2013.01); G11C 11/40611 (2013.01); G11C 11/40618 (2013.01)

(58) Field of Classification Search
CPC ............ G11C 11/4078; G11C 12/0207; G11C 11/40611; G11C 11/40618
See application file for complete search history.

(56) References Cited

U.S. PATENT DOCUMENTS

| 7,464,241 | B2 * | 12/2008 | Vogt ......................... G11O 5/04 711/111 |
| 8,612,828 | B2 | 12/2013 | Brzezinski |
| 9,391,637 | B2 | 7/2016 | Agrawal et al. |
| 9,495,232 | B2 | 11/2016 | Gjorup |
| 9,524,771 | B2 * | 12/2016 | Sriramagiri ....... G11C 11/40618 |
| 9,691,505 | B2 | 6/2017 | Das et al. |
| 9,740,558 | B2 | 8/2017 | Halbert et al. |
| 10,108,512 | B2 | 10/2018 | Halbert et al. |
| 10,127,101 | B2 | 11/2018 | Halbert et al. |
| 10,249,351 | B2 * | 4/2019 | Kang ..................... G11C 16/10 |
| 2018/0189140 | A1 | 7/2018 | Motwani |
| 2018/0203761 | A1 | 7/2018 | Halbert et al. |
| 2018/0210787 | A1 | 7/2018 | Bains et al. |
| 2018/0254079 | A1 | 9/2018 | Cox et al. |
| 2019/0139596 | A1 * | 5/2019 | Jang .................. G11C 11/40615 |

* cited by examiner

*Primary Examiner* — Pho M Luu
(74) *Attorney, Agent, or Firm* — Compass IP Law PC

(57) ABSTRACT

A memory device with internal row hammer mitigation includes randomization for selection of victim rows to refresh for row hammer mitigation. When memory devices connected in groups all use the same probabilistic determination of which row to select for row hammer mitigation, all memory devices could miss refreshing the same victim row, resulting in data loss. With randomization of the selection, the memory devices are more likely to select different potential victim rows for refresh, reducing the risk of data loss. The memory device performs row hammer mitigation during a refresh operation on a row selected based on a recent activate command. Selection of the victim row can be performed with a pseudo-random computation based on a value unique to the memory device in the group.

20 Claims, 9 Drawing Sheets

REGISTER 600

| | MR ADDR | OPERATING MODE | DESCRIPTION |
|---|---|---|---|
| 610 | $Mx_1Ay_1$ | PDA ENUMERATE PROGRAMMING MODE | READ ONLY MR FIELD, PROGRAMMED VIA MPC COMMAND USED TO PROGRAM PDA ENUMERATE ID<br><br>0 = PDA ENUMERATE PROGRAMMING MODE DISABLED<br>1 = PDA ENUMERATE PROGRAMMING MODE ENABLED |
| 620 | $Mx_2Ay_2$ | PDA ENUMERATE ID [3:0] | READ ONLY MR FIELD, PROGRAMMED VIA MPC COMMAND WITH PDA ENUMERATE ID OPCODE<br><br>$XXXX_b$ = ENCODING SENT WITH MPC COMMAND WITH PDA ENUMERATE ID OPCODE – SET WHEN PDA ENUMERATE PROGRAMMING MODE ENABLED AND DQ0 ASSERTED LOW |
| 630 | $Mx_3Ay_3$ | PDA SELECT ID [3:0] | READ ONLY MR FIELD, PROGRAMMED VIA MPC COMMAND WITH PDA SELECT ID OPCODE<br><br>DRAMs EXECUTE MRW, MPC, VrefCA ONLY IF PDA SELECT ID MATCHES PDA ENUMERATE ID, OR $1111_b$ |

FIG. 6

COMMAND TABLE 700

| FUNCTION | ABBR | CS | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|---|
| ACTIVATE | ACT | L | L | L | R0 | R1 | R2 | R3 | BA0 | BA1 | BG0 | BG1 | BG2 | CID0 | CID1 | CID2 |
| | | H | R4 | R5 | R6 | R7 | R8 | R9 | R10 | R11 | R12 | R13 | R14 | R15 | R16 | CID3/R17 |
| MODE REGISTER WRITE | MRW | L | H | L | H | L | L | MRA0 | MRA1 | MRA2 | MRA3 | MRA4 | MRA5 | MRA6 | MRA7 | V |
| | | H | OP0 | OP1 | OP2 | OP3 | OP4 | OP5 | OP6 | OP7 | V | V | CW | V | V | V |
| REFRESH ALL | REF | L | H | H | L | L | H | CID3 | V | V | V | V | L | CID0 | CID1 | CID2 |
| REFRESH SAME BANK | REFsb | L | H | H | L | L | H | CID3 | BA0 | BA1 | V | V | H | CID0 | CID1 | CID2 |
| SELF REFRESH ENTRY | SRE | L | H | H | H | L | H | V | V | V | V | V | L | V | V | V |

FIG. 7

ROW HAMMER MITIGATION WITH RANDOMIZATION OF TARGET ROW SELECTION

FIELD

Descriptions are generally related to computer memory systems, and more particular descriptions are related to mitigation of data loss due to row hammer events.

BACKGROUND

As computer devices continue to decrease in size and increase in capacity and capability, the minimum device geometries used to manufacture the components continues to decrease. The decreases in device geometries enables continued system scaling by enabling improved performance with lower power consumption. However, the decreasing geometries create component-level issues. For example, the decreasing geometries that enable memories to increase in capacity and access speeds exacerbate row hammer or row disturb issues. "Row hammer" refers to a failure caused by repeated access to a target row or aggressor row within a time period. The failure is actually in a victim row that is adjacent or proximate to the target/aggressor row, where repeated activation of the target row causes migration of charge across the passgate of the victim row, resulting in a nondeterministic state of the victim row. Row hammer is a known issue in DRAM (dynamic random access memory) devices.

Row hammer mitigation managed by the memory controller is increasingly impractical because of amount of data that would either needed to be managed by the memory controller or exchanged between the memory controller and DRAM devices. Mitigation within the DRAM device itself typically involves the DRAM device tracking row hammer or performing heuristic operation to address row hammer. However, with the decreasing device geometries, the number of activates to a specific row that could cause a row hammer event has gone from 500K to 300K, and is now projected to be at 100K and even decrease to a range of about 30K-50K activates. With fewer activates needed to cause a row hammer event, more rows could be aggressors within the refresh window.

Thus, the complexity of row hammer mitigation increases as the number of activates decreases. Therefore, traditional row hammer mitigation techniques in the DRAM device are unlikely to scale to future devices, and more refreshes will be needed to address row hammer. Additionally, when all DRAM devices of a group (e.g., all devices in a rank) apply the same mitigation algorithm, they will refresh the same potential victim rows, which could starve out more and more victim rows resulting in data loss.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 6 is a representation of an example of mode register settings including a PDA enumeration ID.

FIG. 7 is a representation of an example of selected commands in a command truth table of a system that supports row hammer mitigation.

Descriptions of certain details and implementations follow, including non-limiting descriptions of the figures, which may depict some or all examples, and well as other potential implementations.

DETAILED DESCRIPTION

As described herein, a memory device with internal row hammer mitigation includes randomization for selection of victim rows to refresh for row hammer mitigation. When memory devices connected in groups all use the same probabilistic determination of which row to select for row hammer mitigation, all memory devices could miss refreshing the same victim row, resulting in data loss. When the memory devices of a group of memory devices apply randomization to the selection algorithm, they are expected to select different victim rows for mitigation refresh, which would result in different memory devices refreshing different rows for row hammer mitigation. Modern memory devices are typically capable of correcting an error resulting from the loss of data from an entire memory device, but not from multiple memory devices which results in an uncorrectable error and therefore data loss. If the memory devices refresh different rows, there is significantly reduced likelihood that a row hammer event would result in data loss, because of the decreased likelihood that any given victim row will be missed from row hammer mitigation.

Row hammer mitigation techniques implemented in a memory device tend to be probabilistic or heuristic-based. With a probabilistic approach, it is possible for a row hammer refresh to not occur for a particular victim row in time to prevent a row hammer event, where the row loses sufficient charge to make its state indeterminate. The randomization of the selection of a row for row hammer mitigation means that memory devices in a group (e.g., a rank) can apply the same row hammer mitigation technique and apply internal row hammer mitigation refresh to different rows. With randomization of the selection, the memory device performs row hammer mitigation during a refresh operation on a row selected based on a randomization for a recent activate command. Selection of the victim row can be performed with a pseudo-random computation based on a value unique to the memory device in the group. The value can be stored in a register as a unique value for the memory device within the group. In one example, the unique value is an enumeration ID (identifier) assigned to the memory device for PDA (per device addressability, also referred to as per DRAM addressability for DRAM devices) operation. In one example, the register stores a value assigned to the memory device for row hammer mitigation randomization (e.g., a randomization seed value). In one example, the register stores a DRAM (dynamic random access memory) device ID for position assignment within a DIMM (dual inline memory module).

Figure 1:
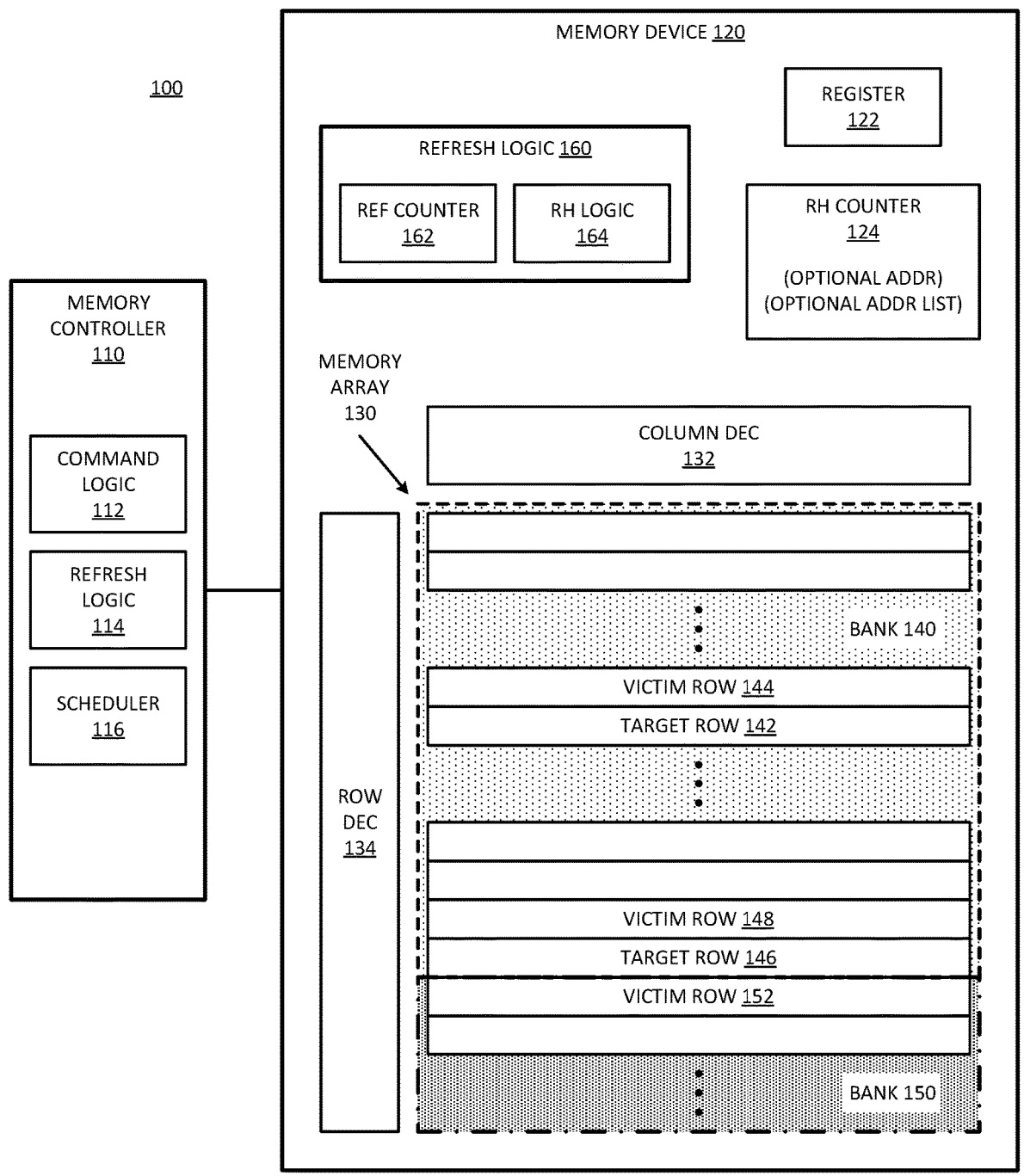
FIG. 1 is a block diagram of an embodiment of a system that performs row hammer mitigation including mitigation row selection randomization.

FIG. 1 is a block diagram of an embodiment of a system that performs row hammer mitigation including mitigation row selection randomization. System 100 includes memory device 120 coupled to memory controller 110. Memory device 120 can include any type of memory technology that has adjacent rows of memory cells, where data is accessible via a wordline or the equivalent. In one example, memory device 120 includes DRAM technology.

Memory device 120 includes memory array 130, which represents an array of memory cells or storage cells. A memory cell stores a bit of data, or multiple bits for a multilevel cell. Memory array 130 includes a representation of potential row hammer situations. For purposes of example, memory array 130 shows bank 140 and bank 150. It will be understood that memory array 130 can include multiple banks. In general, a bank or a sub-bank of memory includes memory cells that are addressable separately from memory cells of another bank or sub-bank.

Memory device 120 includes column decoder (dec) 132 which represents circuitry to apply charge to a column based on an access command. In one example, the circuitry selects a column in response to a column address strobe (CAS) command. Memory device 120 includes row decoder (dec) 134 which represents circuitry to apply selection voltages to rows based on a memory access command. In one example, the circuitry selects a column in response to a row address strobe (RAS) command.

Memory controller 110 includes command logic 112 to generate commands for memory device 120. Commands can include commands such as Write commands or Read commands. Commands can also include Activate commands, Precharge commands, Refresh commands, or other commands. In one example, memory controller 110 includes refresh logic 114, which represents logic to control the refreshing of memory device 120. Refresh logic 114 can include one or more counters to determine the need for refresh of memory device 120 and register space to track the sending of refresh commands. Refresh commands can include external refresh commands (e.g., REF, REFpb) where the memory device continues to operate in accordance with a clock signal from memory controller 110. Refresh commands can include a self refresh command (e.g., SRE) where the memory device operates on an internal clock instead of based on a clock signal from the memory controller. An external refresh has a specific window for completion of the command, and self refresh is a state the memory device can be in for a non-specific amount of time.

Memory controller 110 includes scheduler 116 to manage the scheduling and sending of sequences of commands to memory device 120. Scheduler 116 includes logic to determine the order of commands, as well as timing requirements for the commands. Memory controller 110 has to make determinations of what commands to send. It will also make determinations of the order of commands to ensure compliance with timing requirements. Scheduler 116 can enable memory controller 110 to make certain determinations regarding commands and timing. In one example, scheduler 116 determines how many external refresh commands to send during a refresh window. Scheduler 116 can generate an extra refresh command to enable row hammer mitigation.

For an illustration of a row hammer condition, memory array 130 includes target row 142 in bank 140. A physically proximate row or a physically adjacent row can suffer from unintentional programming or disturb of one or more values stored in the row based on repeated access to target row 142 within a time period prior to a refresh operation on the row. Victim row 144 represents a row that is subject to row hammer when target row 142 is repeatedly accessed. When victim row 144 is at risk of a row hammer event, target row 142 can be referred to as an aggressor row. There may be another row in bank 140 that is a victim row to target row 142.

In one example, bank 140 also includes target row 146. Consider that target row 146 is at or near a bank boundary. It will be understood that the rows in memory array 130 may have a spacing that is not different even if the rows are in different banks. Rather, the separation of one bank to another can be defined by selection or decode hardware elements. Thus, depending on the architecture of the physical layout of the rows, a row on the boundary of bank 150 could also be at risk for a row hammer event based on access to target row 146. In one example, repeated access to a target row can cause a disturb of multiple adjacent rows. In as illustrated, target row 146 can result in row hammer events to both victim row 148 of bank 140 and victim row 152 of bank 150.

Memory device 120 includes register 122, which represents one or more registers or storage locations to store configuration information or values related to the operation of memory device 120. In one example, register 122 includes one or more mode registers. In one example, register 122 includes configuration information to control the application of refresh internally to memory device 120.

In one example, memory device 120 includes one or more row hammer (RH) counters 124. Counter 124 can be or include row hammer detection logic. In one example, memory device 120 detects potential row hammer conditions and performs operations to mitigate the risk associated with a row hammer event. In one example, counter 124 keeps a count associated with one or more rows that are being accessed repeatedly. For example, counter 124 can keep an optional address (addr) list of rows with highest activation counts within a refresh window. The counts could be reset after a refresh.

It will be understood that to keep track of the number of activates per row would be impractical, as 1 million counters or more would be required per bank in certain memory devices. Memory devices typically employ heuristics or perform based on probabilities to apply row hammer mitigation. Instead of tracking the activates for all rows, only selected rows could be tracked. When a counter reaches a threshold number refresh logic 160 can perform a row hammer refresh. In such an implementation, the lowest count could be replaced each time a new row is activated. In one example, counter 124 keeps the list of the rows with the highest number of activates, and performs a row hammer mitigation for the row or rows with the highest number of activates when an external refresh command is received. As such, refresh logic 160 does not necessarily wait until reaching a threshold number before performing a row hammer refresh mitigation.

Another heuristic technique is to randomly assign a row hammer refresh for a randomly selected row that has received an activate. Such an implementation may only need counter 124 to optionally store the address of the recently activated row. In theory a row that is repeatedly activated will have a higher likelihood of being randomly selected for row hammer mitigation refresh. Thus, probabilistically the rows being hammered or accessed repeatedly are also the rows more likely to be selected for row hammer mitigation. The logic and circuitry requirements of such an approach are simpler than what is required for keeping a list of rows, but is less precise in row hammer mitigation.

Refresh logic 160 represents logic within memory device 120 to control refresh of rows within memory array 130. Refresh logic 160 responds to external refresh commands sent by refresh logic 114 of memory controller 110. Refresh logic 160 controls the operation of refresh during self refresh operation of memory device 120. Refresh logic 160 includes refresh (ref) counter 162 to track row addresses for scheduled refresh operations. Scheduled refresh operations include refresh of sequential rows to ensure all rows are refreshed within the refresh period. Refresh logic 160 of memory controller 110 is responsible to ensure that sufficient refresh operations are scheduled for memory device 120 to meet refresh requirements. Typically refresh logic 114 will schedule more refresh operations than necessary in a refresh period.

In one example, refresh logic 160 includes row hammer logic 164 to provide refresh operations for row hammer mitigation. Row hammer mitigation refers to refresh of potential victim rows to avoid row disturb. In operation, counter 124 can indicate a target row to row hammer logic 164, which can trigger "refresh stealing" by refresh logic 160. Refresh stealing refers to refresh logic 160 performing refresh of victim rows associated with the indicated target row instead of performing a refresh of a row indicated in refresh counter 162. Thus, row hammer mitigation refresh operations are out of order with respect to the refresh row pointer or counter. Row hammer mitigation can include stealing all refreshes of an entire refresh operation or a refresh cycle, or simply one or more refreshes of a refresh operation. In response to an external refresh command memory device 120 typically performs refresh of multiple rows. The refresh operation refers to the refresh of all the rows to be refreshed in response to a single refresh command. The refresh operation has a time tRFC (row refresh cycle time), and there will be an average refresh interval of tREFI (refresh interval time) between refresh operations in the refresh period or refresh window. The refresh period refers to a time between refreshes of any given row to avoid loss of data in the row. A refresh can refer to the refresh of a single row of all the rows to be refreshed in response to the refresh command, and has a time less than tRFC since a single refresh operation includes multiple refreshes.

It will be understood that there can be multiple target rows in the same bank, such as what is illustrated in bank 140. As the critical number for row hammer decreases, because the number of activates required to cause a row disturb continues to decrease, the number of potential aggressor rows will increase. Thus, the number of row hammer mitigation operations needed per refresh period continues to increase. To permit more row hammer mitigation operations, memory controller 110 sends more external refresh commands. Refresh (whether external or internal) is the only time the memory controller and memory device can ensure that there will be no access to a row. It will be understood that different banks can be refreshed at different times, and thus be unavailable for access at different times. Banks not being refreshed can be accessed, and thus, scheduler 116 will manage the scheduling of refreshes of different banks.

The addition of the number of refreshes to enable row hammer mitigation will increase the amount of bandwidth used for refresh. However, not refreshing could result in data loss. In one example, row hammer logic 164 includes a randomization engine to cause randomization of the selection of a row for row hammer mitigation refresh. Memory device 120 can be one of multiple memory devices in a group, such as one DRAM of multiple DRAM devices in a rank. The different memory devices can employ the same randomization with the use of different randomization factors. In one example, register 122 stores a value unique to memory device 120 among the memory devices of its group. In one example, the unique value is an identifier for the memory device, such as a PDA enumeration number. When the memory devices in the group randomize row hammer mitigation selection, the likelihood of multiple memory devices in the same group will miss refreshing the same row is significantly decreased. Decreasing the likelihood of missing a needed row hammer mitigation reduces the likelihood that data will be lost. In one example, refresh logic 160 provides randomization by delaying or advancing a row hammer mitigation by a number of execution cycles.

Figure 2:
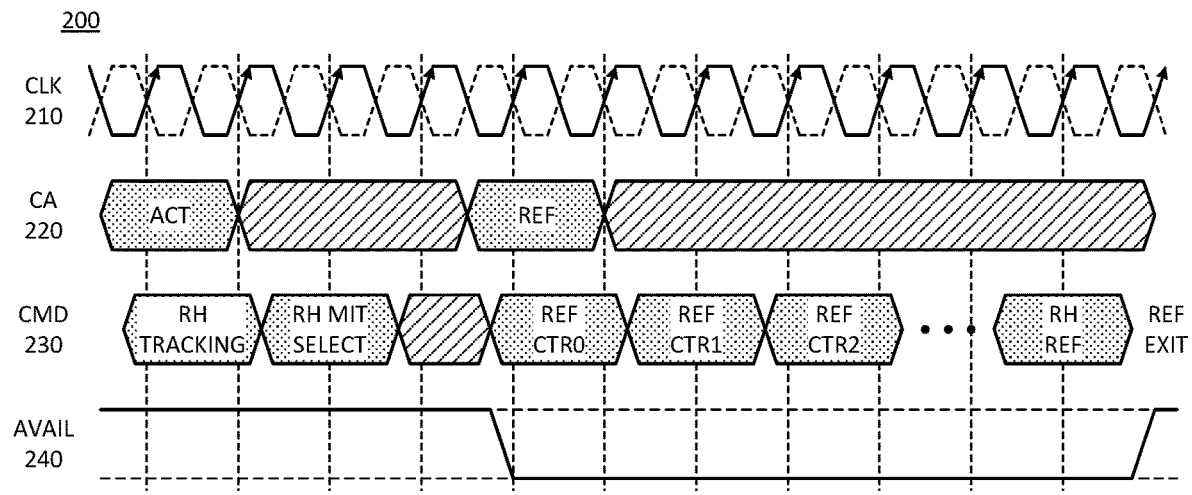
FIG. 2 is a timing diagram of an example of timing of per device addressability enumeration.

FIG. 2 is a timing diagram of an example of timing of per device addressability enumeration. Diagram 200 represents a timing diagram for refresh with row hammer mitigation. Diagram 200 represents multiple interconnections between a host or memory controller and associated memory devices. The interconnection is provided through one or more signal lines.

CLK 210 represents a clock for the system, and both the clock (CK_t) and the complement (CK_c) are illustrated. For the example of diagram 200, the clock is the solid line signal with the arrows to indicate a rising edge. The complement is illustrated as a dashed line. CA 220 represents a command/address signal sent on C/A signal lines, and indicates a command encoding as provided by the host. CMD 230 represents a decoding of the command encoding, and can thus represent a signal internal to the memory device for operations generated to carry out the command. AVAIL 240 represents the availability of the memory device with a logic high meaning the memory device is available, and a logic low meaning the memory device is unavailable.

While not illustrated in diagram 200, at some point prior to the sequence illustrated the host will provide a value to the memory device which the memory device stores for later use. CA 220 illustrates ACT command, which is followed on CMD 230 by one or more internal operations for row hammer (RH) tracking. It will be understood that the row hammer tracking is in addition to executing the activate command on the row indicated by an address accompanying the activate command. In a system that keeps track of multiple counters for row hammer mitigation, the row hammer tracking can include updating counter information. In a system that uses row hammer mitigation refresh based on randomly or pseudo randomly selected activate commands, the activate command can be considered a command to trigger row hammer mitigation. The row hammer tracking in such a situation can place the address of the row that is the target of the activate command into a register or counter to identify a target row.

In the case where the activate command triggers a row hammer mitigation, CMD 230 illustrates a row hammer mitigation (RH MIT) selection by the memory device. Row hammer mitigation selection can include the memory device selecting from among multiple possible candidates for row hammer mitigation. Row hammer mitigation selection includes selection of the victim row or rows that should be refreshed for the mitigation refresh.

Typically, a row hammer mitigation refresh will occur in response to a subsequent refresh command sent by the host. Refresh is the only time the memory device will be assured that the host will not try to access the memory device, which permits the memory device to perform refresh on the row hammer victim instead of in accordance with a refresh counter. Thus, CA 220 has a refresh command, which is a subsequent refresh command after the activate that triggered the row hammer mitigation. In one example, in response to the refresh command, CMD 230 illustrates a sequence of internal refresh commands to carry out the refresh operation for the command. In response to the refresh command, the memory device goes into a refresh state, and at least a memory bank that is the subject of the refresh command becomes unavailable as seen by the logical transition on AVAIL 240.

In one example, the memory device refreshes multiple rows for every refresh command. In one example, the memory device performs refresh of one or more victim rows at an end of the refresh operation. Thus, CMD 230 illustrates REF CTR0 to represent refresh of an address that is pointed to by a refresh counter or pointer. REF CTR1 and REF CTR2 represent refreshes of rows at addresses subsequent to the first address refreshed. In one example, the one or more victim rows are refreshed with row hammer (RH) refreshes at the end of the refresh sequence. After performing the row hammer mitigation refresh the memory device exists refresh (REF EXIT), and AVAIL 240 transitions to available.

In accordance with what is described herein, RH MIT selection includes randomization of the potential target row based on a recently received activate command. The randomization can include randomization of which target row is selected for row hammer mitigation. In one example, the randomization can include selection from among multiple target row candidates. The multiple candidates can be a list of rows for which a count of activates is kept. In one example, the multiple candidates can simply a list of the last N number of rows to have received an activate command (e.g., the last 5 rows or the last 10 rows). Such an implementation enables the use of simple logic and only a few counters, but provides a pool for pseudo random selection. The randomization can include a pseudo random computation based on the stored unique value. The randomization can randomly decide from among candidates that have a highest number of activates, or simply from among the candidates that are the most recent rows to receive activates, or some other selection algorithm.

Figure 3:
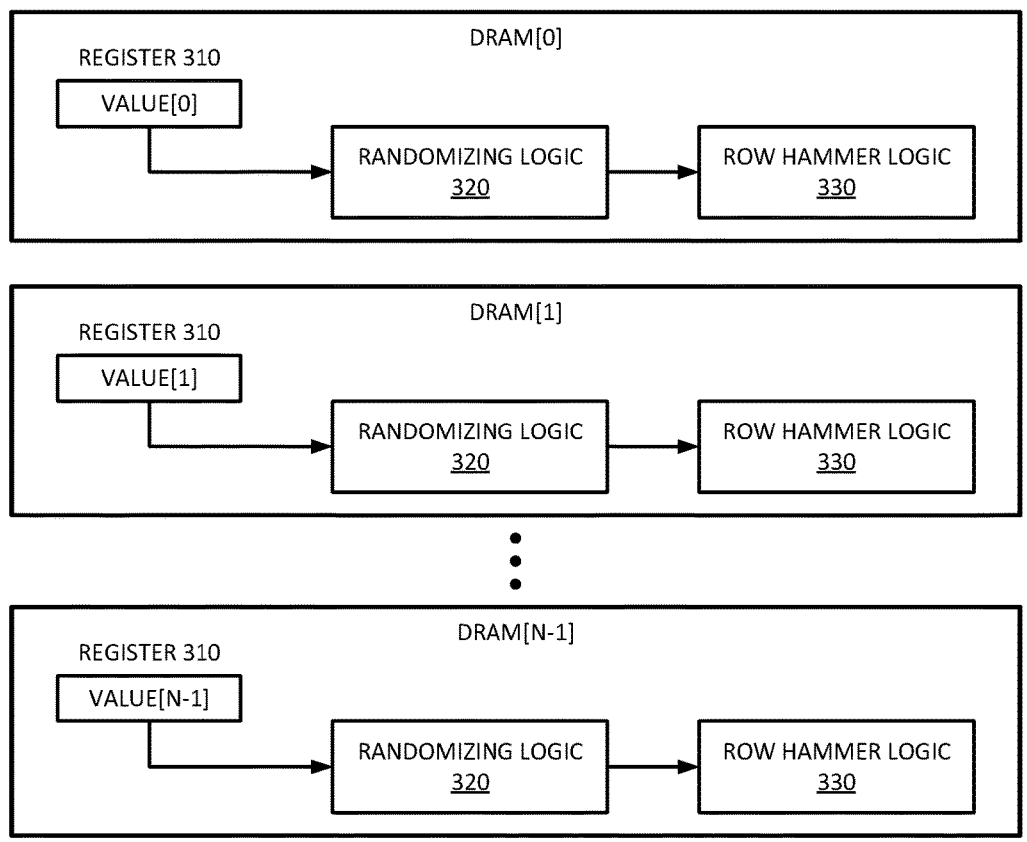
FIG. 3 is a block diagram of an embodiment of a system where DRAM devices perform randomization of row hammer mitigation selection.

FIG. 3 is a block diagram of an embodiment of a system where DRAM devices perform randomization of row hammer mitigation selection. System 300 represents a group of DRAM devices identified as DRAM[0:(N−1)]. The group of DRAM devices can be memory devices in accordance with memory device 120 of system 100.

In one example, DRAM[0:(N−1)] include register 310. Registers 310 store values that are unique for the DRAM devices in the group. It will be understood that the values do not necessarily have to be unique within the entire system. For example, if a memory subsystem includes multiple separate groups of DRAM devices (e.g., multiple ranks), the values could be repeated among DRAM devices of the two separate groups and still be unique for a specific DRAM device within its group. To represent the uniqueness of the values, registers 310 are illustrated with value[0:(N−1)] respectively for DRAM[0:(N−1)].

In one example, register 310 represents a mode register. In one example, register 310 stores a PDA enumeration value. In one example, register 310 stores a value set as a randomization value for randomization operations including row hammer mitigation selection. In one example, register 310 represents a DRAM ID for a DIMM.

The DRAM devices include randomizing logic 320 to perform a randomization computation for row hammer selection. Randomizing logic 320 creates a very high likelihood that each DRAM device will select a different candidate for row hammer mitigation. In one example, randomizing logic 320 includes a linear feedback shift register (LFSR) to generate a pseudo random number based on the value stored in register 310 as a seed value. An LFSR is a commonly-used component for pseudo random number generation. Other circuitry that could generate a random number or a pseudo random number for randomization can be or include an exclusive OR (XOR) shift generator, a block cipher generator, a combinatorial logic generator, or a combination of these components, or another component that generates a random value.

The implementation of randomization logic can be different for different systems. True randomness may require more circuitry than would be practical to implement in a DRAM device for row hammer randomization. Randomization circuitry identified above may not be practical for certain implementations. However, true randomness is typically desired for cryptographic security, and the row hammer selection randomization does not need to be secure, but just to produce a value different from other DRAM devices in a group.

In one example, the DRAM devices include row hammer logic 330 to trigger refresh of victim rows of an aggressor row in response to the selection of the aggressor row by randomizing logic 320. In one example, randomizing logic 320 performs random selection from among multiple potential aggressor row candidates. Thus, each DRAM device will select a different target row, resulting in refresh of different victim rows. Therefore, even if any given DRAM device misses refreshing a row or multiple rows from row hammer mitigation, resulting row hammer events can be localized to blocks of data within specific DRAM devices and not in multiple DRAM devices.

Figure 4:
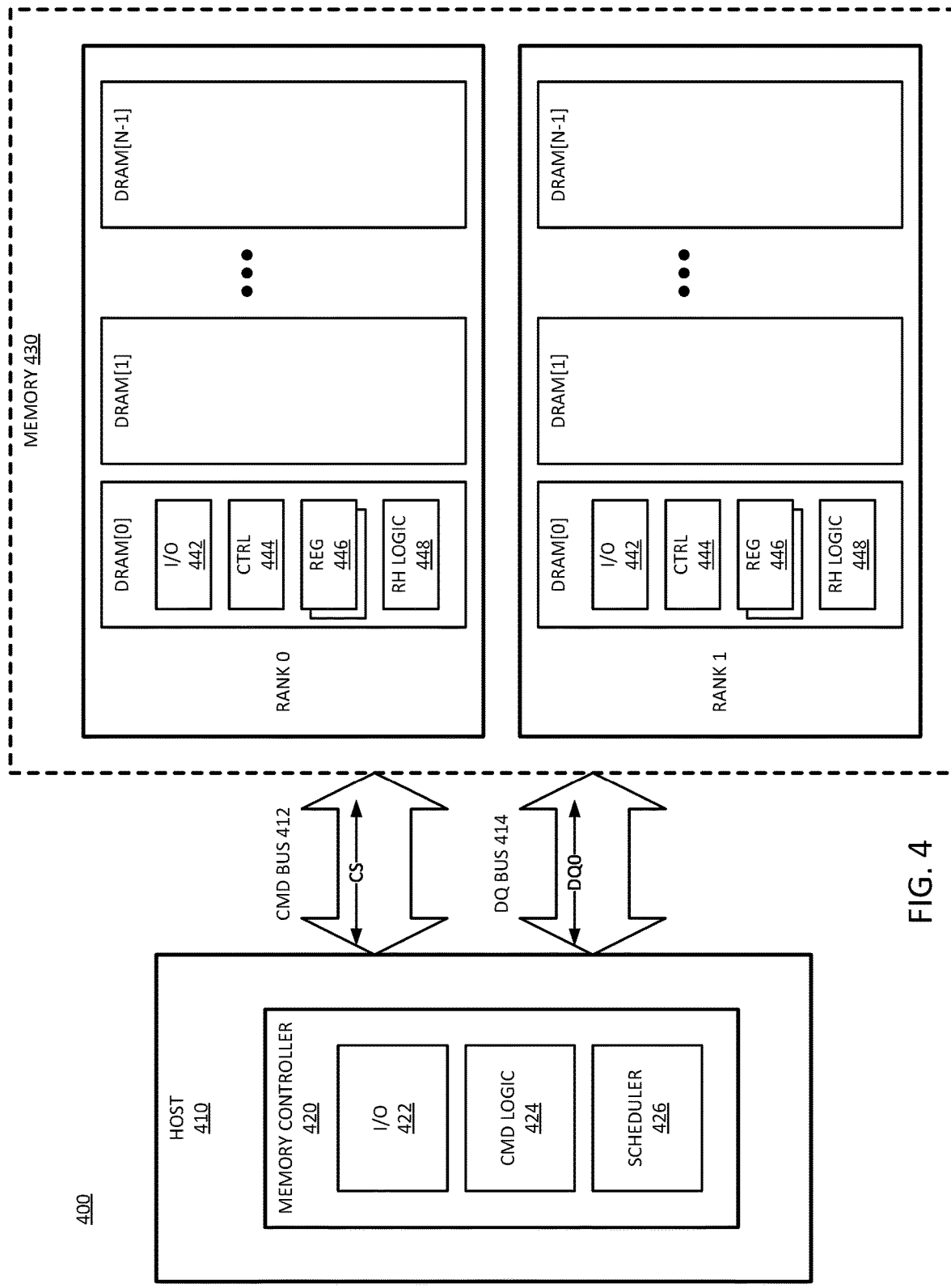
FIG. 4 is a block diagram of an example of a memory subsystem in which row hammer mitigation randomization based on PDA enumeration can be implemented.

FIG. 4 is a block diagram of an example of a memory subsystem in which row hammer mitigation randomization based on PDA enumeration can be implemented. System 400 represents elements of a computing system. System 400 can be considered to have a memory subsystem with memory controller 420 and memory 430. Host 410 represents the hardware platform that controls the memory subsystem. Host 410 includes one or more processors (e.g., a central processing unit (CPU) or a graphics processing unit (GPU)) that generate requests for data stored in memory 430.

Host 410 includes memory controller 420, which can be integrated onto a processor device. Memory controller 420 includes I/O (input/output) 422 to connect to memory 430. I/O includes connectors, signal lines, drivers, and other hardware to interconnect the memory devices to host 410.

I/O 422 can include command I/O as represented by command (CMD) bus 412, and data I/O as represented by DQ (data) bus 414. CMD bus 412 includes command signal lines that enable memory controller 420 to send commands to memory 430. The command signal lines include a CS (chip select) signal line. While illustrated as a chip select line, in one example, the chip select can be another type of device select. DQ bus 414 includes multiple data signal lines, including a DQ[0] or DQ0 signal line. For an N-bit interface, DQ bus 414 will include DQ[0:N−1]. DQ0 can be considered the first or least significant bit (LSB) of the data bus, and will thus be present in all DQ interfaces. Traditional PDA operation requires the use of DQ0 prior to training the DQ signal lines.

Memory controller 420 includes command (CMD) logic 424 to generate commands for memory. The commands can be commands for data access (such as Read, Write, Refresh, or other commands), or commands for configuration (such as mode register commands). Memory controller 420 includes scheduler 426 to schedule when to send commands in a sequence of operations. Scheduler 426 can control the timing for I/O in accordance with known timing to improve the chance that I/O will be error free. The timing is set through training.

Memory 430 can include individual memory devices, or can represent a memory module. System 400 illustrates two ranks of memory devices in memory 430. A rank refers to a collection or group of memory devices that share a select line. Thus, memory devices in a rank will execute operations in parallel. Rank[0] and Rank[1] are illustrated to include N DRAM devices or DRAMs. Typically, a system with multiple ranks will have the same number of DRAMs in each of the ranks.

DRAM[0] of Rank[0] and DRAM[0] of Rank[1] are shown to include I/O 442, control (CTRL) 444, and registers (REG) 446. Such components will be understood to be included in the other DRAMs as well. I/O 442 represents connection hardware comparable to I/O 422 of memory controller 420. I/O 442 enables connection of DRAMs to memory controller 420. Control logic 444 represents control components within the DRAM to decode and execute the commands and access operations. Control 444 causes the DRAM to perform the internal operations needed to execute the access initiated by memory controller 420. Register 446 represents one or more registers within the DRAM. Register 446 can include one or more configuration registers such as mode registers. Register 446 can store configuration information and information that determines a mode of operation by the DRAM in response to signals on command and data signal lines. In one example, the DRAMs include a register 446 to store a unique value for the DRAM devices.

The DRAMs also include row hammer (RH) logic 448, which represents row hammer logic in accordance with what is described herein. Row hammer logic 448 enables the DRAMs to identify one or more target row candidates that can be randomly selected for row hammer mitigation operation in response to receipt of an external refresh command from memory controller 420. In one example, register 446 stores a PDA enumeration value set in accordance with what is described below, and use that value as a seed value for randomization logic of row hammer logic 448.

In one example, memory controller 420 can set or reset a bit of a mode register of register 446 of a given DRAM to control whether the DRAM is in PDA enumeration mode. PDA enumeration can refer to a mode where memory controller 420 sets an enumeration identifier (ID) for the DRAMs that can be used for PDA without use of DQ bus 414. In one example, when memory controller 420 sets a DRAM for PDA enumeration ID operation, the memory controller can assign the enumeration ID with a combination of command on command bus 412, and the assertion of a signal on DQ bus 414. For example, memory controller 420 can place Rank[0] in enumeration ID mode by writing a command to registers 446 for all DRAMs in the rank. The PDA enumeration ID can be reused for row hammer mitigation in accordance with any description herein.

Figure 5:
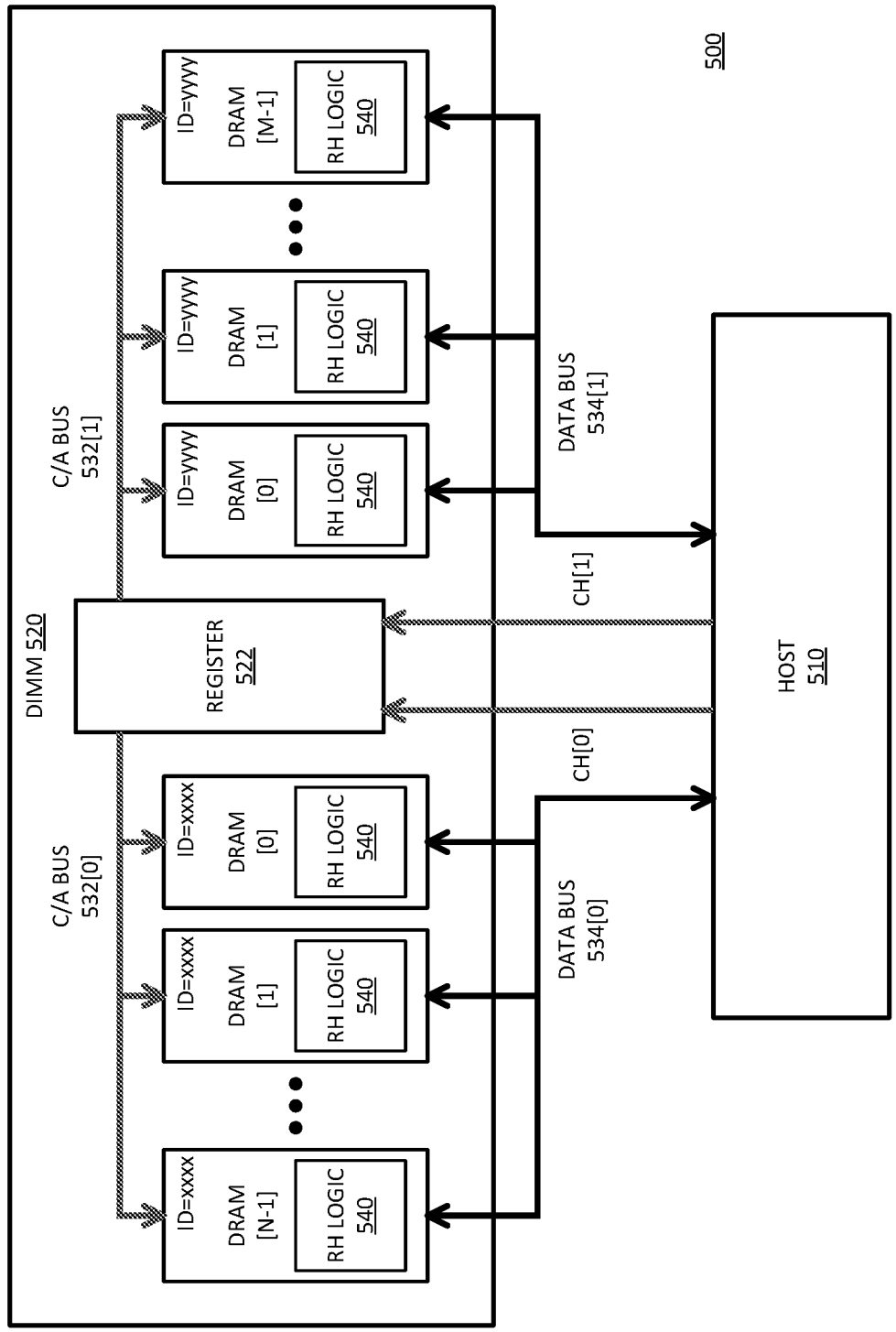
FIG. 5 is a block diagram of an example of a DIMM in which row hammer mitigation randomization based on a unique value can be implemented.

FIG. 5 is a block diagram of an example of a DIMM in which row hammer mitigation randomization based on a unique value can be implemented. System 500 provides one example of a DIMM system in accordance with memory 430 of system 400, or with a group of DRAM devices in accordance with system 300. DIMM 520 represents a memory module that includes multiple memory devices identified as two different channels of DRAM devices. System 500 can alternatively be implemented as a multi-device or multichip memory package, such as with stacked DRAMs and control logic that operates as register 522.

In one example, system 500 applies PDA to set device configuration for specific DRAM devices, and reuses a PDA enumeration value as a seed for randomization logic for row hammer mitigation selection. System 500 includes DIMM 520 Channel 0 (CH[0]) having N DRAM devices, DRAM[0:N−1], and Channel 1 (CH[1]) includes M DRAM device, DRAM[0:M−1]. In one example, N=M. Depending on the system configuration, the DRAMs can have x4 data bus interfaces, x8 data bus interfaces, x16 data bus interfaces, or some other interface.

System 500 includes bidirectional data buses 534, with data bus 534[0] for CH[0], and data bus 534[1] for CH[1]. Data buses 534 provide for the exchange of data between the DRAMs and host 510. To access the data and to manage the DRAMs, system 500 includes unidirectional C/A or CMD buses 532, with C/A bus 532[0] for CH[0], and C/A bus 532[1] for CH[1]. C/A buses 532 can be considered unilateral multidrop buses. Typically the configuration is in a fly-by topology. Host 510 provides a command to either CH[0] or CH[1] over a desired C/A bus, which goes through register 522 on DIMM 520. Register 522 forwards the commands to the DRAM devices over C/A buses 532.

Register 570 represents a registering device or an RCD (registered clock driver, which can also be referred to as a registering clock driver). Register 522 can buffer the command traffic signals from host 510 to the various DRAMs, and controls the timing and signaling to the DRAMs. In one example, register 522 can buffer the data traffic as well as the command traffic.

In one example, each DRAM device of DIMM 520 is assigned an ID for the different channels. The IDs for DRAM devices of Channel[0] are illustrated with IDs of a form 'xxxx'. The ID can have as many bits as needed for the number of devices in the group. The IDs will be unique for each DRAM device to enable individual access to the DRAM devices. The IDs for DRAM devices of Channel[1] are illustrated with IDs of a form 'yyyy'. In one example, the ID is used as a value to seed randomization for row hammer mitigation.

The DRAM devices include RH logic 540, which can be row hammer logic in accordance with any description herein. Row hammer logic 540 includes randomization logic based on a unique value of each DRAM device. For example, the randomization can be based on the IDs. In another example, the randomization can be based on a stored enumeration ID (not specifically shown).

FIG. 6 is a representation of an example of mode register settings including a PDA enumeration ID. Register 600 includes mode register fields related to PDA operations. Register 600 can be a specific mode register, or can include values for multiple mode registers. The mode register address (MR ADDR) represents a mode register address, which is designated as a mode register number ($Mx_m$) and a starting address within the register ($Ay_m$).

Row 610 illustrates an address $Mx_1Ay_1$, which represents mode register number x1 at location y1 within the mode register. Row 610 illustrates an address to store bits that control an operating mode of PDA enumerate programming mode. Thus, row 610 represents an address with a field (of one or more bits) to control PDA enumerate programming mode. In one example, a 0 disables the mode and a 1 enables the mode. The field to trigger the mode can be a read only mode register field that is programmed via an MPC (multipurpose command). The host determines when to enable the enumerate programming mode. The PDA enumerate programming mode enables setting unique IDs for the devices.

Row 620 illustrates an address $Mx_2Ay_2$, which represents mode register number x2 at location y2 within the mode register. In one example, row 620 illustrates an address with a field (of one or more bits) to store bits that indicate a PDA enumerate ID. In one example, the enumerate ID is read only with respect to MRS commands, and can only be programmed through an MPC command. In one example, the value can be read with a MRR command but not written with a MRW command. In one example, the value can be written with a MRW command. In one example, the value includes four bits as a binary encoding of a PDA enumerate ID. In one example, the memory device uses the PDA enumerate ID as a seed value for randomization logic to randomize the selection of row hammer mitigation operations in accordance with any description provided.

Row 630 illustrates an address $Mx_3Ay_3$, which represents mode register number x3 at location y3 within the mode register. In one example, row 630 illustrates an address with a field (of one or more bits) to store bits that indicate a PDA select ID. In one example, the select ID is read only with respect to MRS commands, and can only be programmed through an MPC command. In one example, the value includes four bits as a binary encoding of a PDA select ID, to indicate an ID of a device that should execute an MPC command. Only the device with the identified ID will process and execute the command, or with a broadcast ID (such as 1111b). In one example, if the host is to write multiple configuration settings to the same device, the host can write the PDA select ID to all devices, and then send a command for execution by the selected device. For a subsequent command to the same selected device, in one example the host does not need to rewrite the PDA select ID, and only the device with the matching enumerate ID of the previous command will execute the subsequent commands.

FIG. 7 is a representation of an example of selected commands in a command truth table of a system that supports row hammer mitigation. Command table 700 illustrates an example of command encoding for a memory device that performs row hammer mitigation refresh in accordance with any description herein.

For command table 700, the command bus signals can include CS for chip select, and multiple CA signals identified as CA[0:13]. The number of CA signal lines can be more or fewer than what is depicted. The legend for the signal line values can be as follows: BG=bank group address; BA=bank address; R=row address; C=column address; BC8=burst chop 8; MRA=mode register address; OP=opcode; CID=chip identifier; CW=control word; H=logic high; L=logic low; X=Don't Care or it does not matter what state the signal has, and the signal may be floated; and, V=valid meaning any valid signal state, or more specifically, either high or low.

ACT represents an Activate command that can be used in memory array access. As indicated above, a number of activates above a threshold can result in a row hammer event. In one example, a memory device counts the number of activates and performs row hammer mitigation based on the receipt of activate commands. MRW represents a mode register write command. In one example, the MRW command can be used to program a unique ID in the memory device.

Command table 700 includes a Refresh All command REF, to refresh all rows. The REF command causes the memory device to refresh rows in accordance with a row address indicated in a refresh counter. In one example, in accordance with what is described above, the memory device can refresh rows out of order from the refresh counter to perform refresh of victim rows at risk of data loss from a row hammer event. The memory device performs randomization of the selected row.

In one example, command table 700 includes a refresh same bank REFsb command to refresh the same bank in different groups. In one example, the memory device can perform row hammer mitigation refresh as stolen refresh cycles from either REF or REFsb commands. In one example, command table 700 includes a self refresh entry SRE command to cause a memory device to enter a low power state and perform self refresh. It will be understood that SRE is a separate type of command from REF or REFsb. The REF and REFsb commands can be referred to as external refresh commands.

Figure 8:
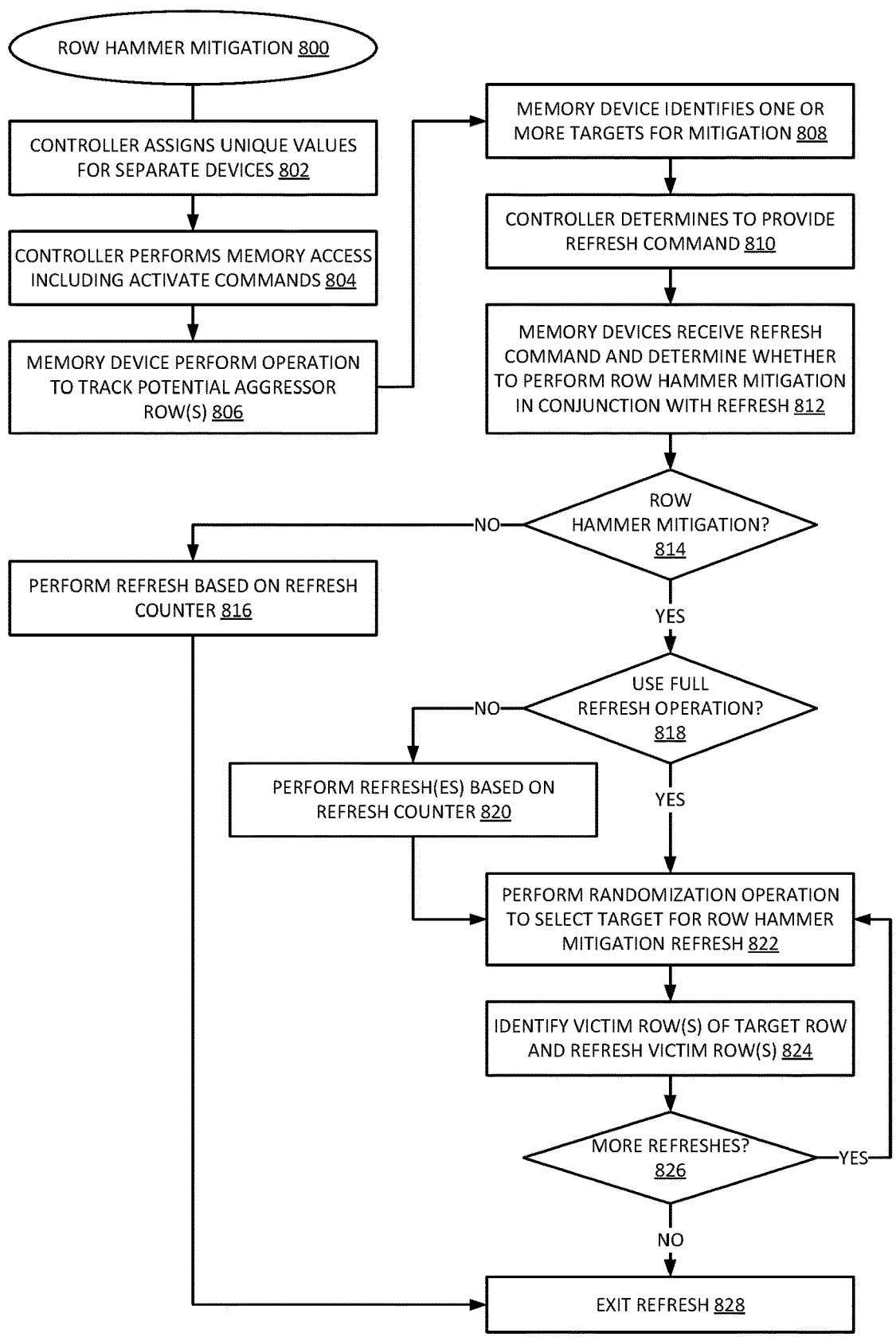
FIG. 8 is a flow diagram of an example of a process for row hammer mitigation with row selection randomization.

FIG. 8 is a flow diagram of an example of a process for row hammer mitigation with row selection randomization. Process 800 provides an example of performing row hammer mitigation. In one example, a memory controller assigns a unique value to each of multiple separate memory devices that are part of a group, block 802. In one example, the controller at some subsequent time performs memory accesses including the application of activate commands, block 804.

In one example, the memory devices perform one or more operations to track potential aggressor rows within a bank, block 806. The tracking can be performed in response to activate commands. In one example, the memory device identifies one or more targets for mitigation, block 808. At some time after multiple activations, the controller determines to provide a refresh command to the memory device, block 810. The refresh command is an external refresh and will provide the opportunity to the memory device to perform row hammer mitigation.

In one example, the memory devices received a refresh command and determine whether to perform row hammer mitigation in response to the refresh command. The row hammer mitigation can be performed in conjunction with refresh, block 812. If the memory device is not to perform row hammer mitigation, block 814 NO branch, the memory device performs refresh based on the refresh counter, block 816. When the refresh operation is completed, the memory device will exit refresh, block 828.

In one example, if the memory device is to perform row hammer mitigation, block 814 YES branch, the memory device determines if it will use the full refresh operation, block 818. If the memory device will not use the full refresh operation, block 818 NO branch, in one example, the memory device first performs one or more refreshes based on the refresh counter, block 820. After a certain number of refreshes the memory device can perform randomization operations to select a target for a row hammer mitigation response, block 822. In one example, if the memory device is to use the entire refresh operation for row hammer mitigation, 818 YES branch, the memory device performs randomization operations to select a target for a row hammer mitigation response to refresh rows for the entire refresh operation, block 822. The randomization can be in accordance with any description provided herein.

In one example, after performing randomization to select a target row as a target for row hammer refresh, the memory device can identify specific victim row(s) associated with the target row, and refresh the victim row(s), block 824. The memory device can typically refresh only a certain address at a time. Thus, to refresh all the rows it will be refreshing during the refresh operation, the memory device first refreshes one row and then determines if there are more refreshes to perform, block 826. If there are more refreshes to perform, block 826 YES branch, the process can return to block 822. If there are no more refreshes to perform for row hammer mitigation, block 826 NO branch, the memory device can exist refresh, block 828.

Figure 9:
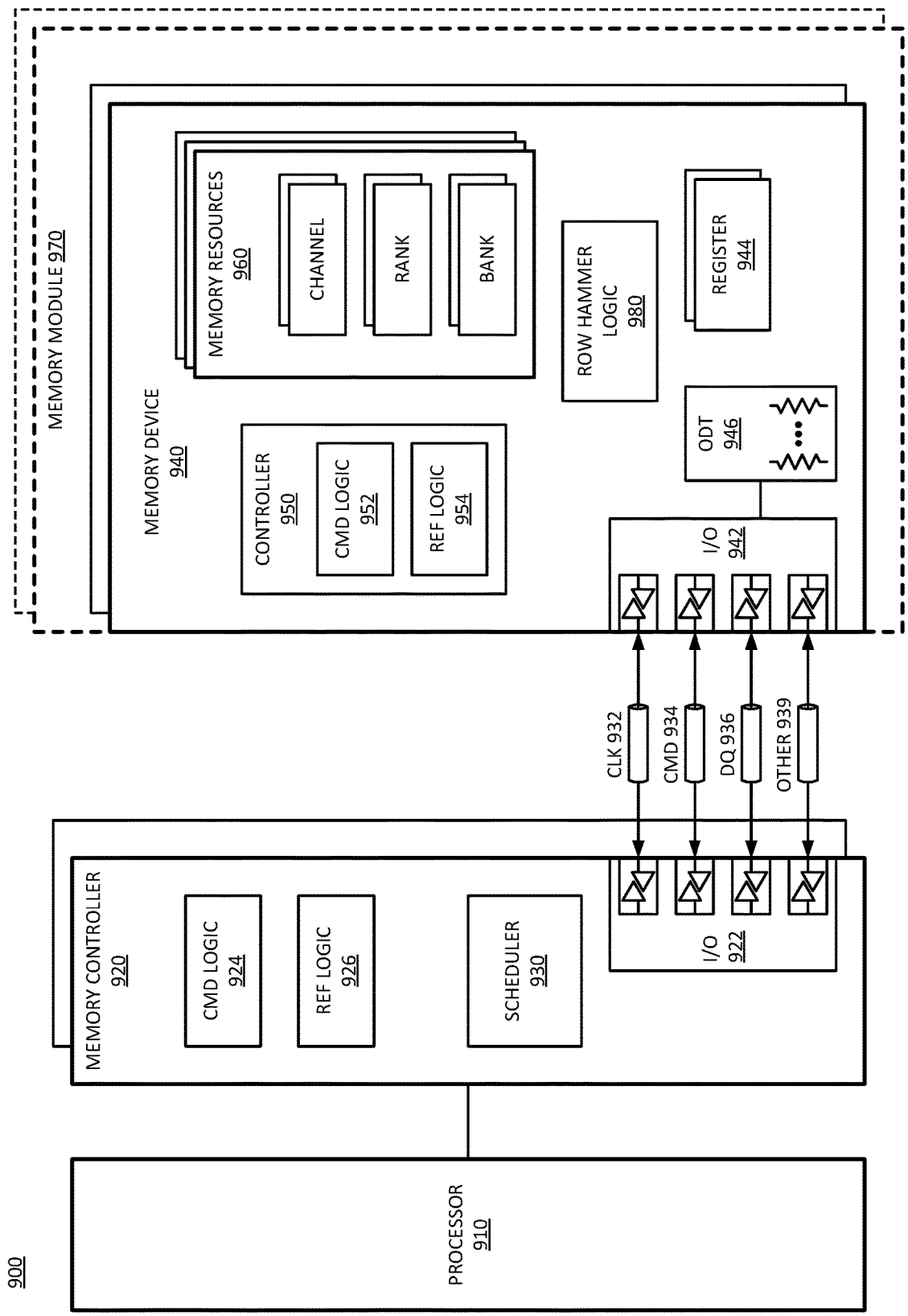
FIG. 9 is a block diagram of an example of a memory subsystem in which row hammer mitigation randomization can be implemented.

FIG. 9 is a block diagram of an example of a memory subsystem in which row hammer mitigation randomization can be implemented. System 900 includes a processor and elements of a memory subsystem in a computing device. System 900 can be in accordance with an example of system 100 of FIG. 1.

In one example, memory device 940 includes row hammer logic 980, which represents row hammer logic in accordance with any description provided herein. Row hammer logic 980 enables the memory device to perform randomization of selection of a row to refresh for row hammer mitigation. Based on receipt of activate commands, the randomization logic randomly selects from among row hammer candidates, and refreshes one or more victim rows associated with the target row selected. The randomization selection can be performed in accordance with any description provided herein.

In one example, memory module 970 represents a DIMM, and includes a register (e.g., an RDIMM or registered DIMM). In one example, memory module 970 includes multiple buffers that are separately addressable. In an RDIMM, the register buffers the C/A bus, but the data lines can be buffered. The command bus specific PDA operation as described herein can be utilized in system 900 with or without a register or buffer or registered clock device.

Processor 910 represents a processing unit of a computing platform that may execute an operating system (OS) and applications, which can collectively be referred to as the host or the user of the memory. The OS and applications execute operations that result in memory accesses. Processor 910 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 900 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 920 represents one or more memory controller circuits or devices for system 900. Memory controller 920 represents control logic that generates memory access commands in response to the execution of operations by processor 910. Memory controller 920 accesses one or more memory devices 940. Memory devices 940 can be DRAM devices in accordance with any referred to above. In one example, memory devices 940 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 920 manages a separate memory channel, although system 900 can be configured to have multiple channels managed by a single controller, or to have multiple controllers on a single channel. In one example, memory controller 920 is part of host processor 910, such as logic implemented on the same die or implemented in the same package space as the processor.

Memory controller 920 includes I/O interface logic 922 to couple to a memory bus, such as a memory channel as referred to above. I/O interface logic 922 (as well as I/O interface logic 942 of memory device 940) can include pins, pads, connectors, signal lines, traces, or wires, or other hardware to connect the devices, or a combination of these. I/O interface logic 922 can include a hardware interface. As illustrated, I/O interface logic 922 includes at least drivers/transceivers for signal lines. Commonly, wires within an integrated circuit interface couple with a pad, pin, or connector to interface signal lines or traces or other wires between devices. I/O interface logic 922 can include drivers, receivers, transceivers, or termination, or other circuitry or combinations of circuitry to exchange signals on the signal lines between the devices. The exchange of signals includes at least one of transmit or receive. While shown as coupling I/O 922 from memory controller 920 to I/O 942 of memory device 940, it will be understood that in an implementation of system 900 where groups of memory devices 940 are accessed in parallel, multiple memory devices can include I/O interfaces to the same interface of memory controller 920. In an implementation of system 900 including one or more memory modules 970, I/O 942 can include interface hardware of the memory module in addition to interface hardware on the memory device itself. Other memory controllers 920 will include separate interfaces to other memory devices 940.

The bus between memory controller 920 and memory devices 940 can be implemented as multiple signal lines coupling memory controller 920 to memory devices 940. The bus may typically include at least clock (CLK) 932, command/address (CMD) 934, and write data (DQ) and read data (DQ) 936, and zero or more other signal lines 938. In one example, a bus or connection between memory controller 920 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 900 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 920 and memory devices 940. An example of a serial bus technology is 8B10B encoding and transmission of high-speed data with embedded clock over a single differential pair of signals in each direction. In one example, CMD 934 represents signal lines shared in parallel with multiple memory devices. In one example, multiple memory devices share encoding command signal lines of CMD 934, and each has a separate chip select (CS_n) signal line to select individual memory devices.

It will be understood that in the example of system 900, the bus between memory controller 920 and memory devices 940 includes a subsidiary command bus CMD 934 and a subsidiary bus to carry the write and read data, DQ 936. In one example, the data bus can include bidirectional lines for read data and for write/command data. In another example, the subsidiary bus DQ 936 can include unidirectional write signal lines for write and data from the host to memory, and can include unidirectional lines for read data from the memory to the host. In accordance with the chosen memory technology and system design, other signals 938 may accompany a bus or sub bus, such as strobe lines DQS. Based on design of system 900, or implementation if a design supports multiple implementations, the data bus can have more or less bandwidth per memory device 940. For example, the data bus can support memory devices that have either a x32 interface, a x16 interface, a x8 interface, or other interface. The convention "xW," where W is an integer that refers to an interface size or width of the interface of memory device 940, which represents a number of signal lines to exchange data with memory controller 920. The interface size of the memory devices is a controlling factor on how many memory devices can be used concurrently per channel in system 900 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 940 and memory controller 920 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 940 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 940 represent memory resources for system 900. In one example, each memory device 940 is a separate memory die. In one example, each memory device 940 can interface with multiple (e.g., 2) channels per device or die. Each memory device 940 includes I/O interface logic 942, which has a bandwidth determined by the implementation of the device (e.g., x16 or x8 or some other interface bandwidth). I/O interface logic 942 enables the memory devices to interface with memory controller 920. I/O interface logic 942 can include a hardware interface, and can be in accordance with I/O 922 of memory controller, but at the memory device end. In one example, multiple memory devices 940 are connected in parallel to the same command and data buses. In another example, multiple memory devices 940 are connected in parallel to the same command bus, and are connected to different data buses. For example, system 900 can be configured with multiple memory devices 940 coupled in parallel, with each memory device responding to a command, and accessing memory resources 960 internal to each. For a Write operation, an individual memory device 940 can write a portion of the overall data word, and for a Read operation, an individual memory device 940 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 940 are disposed directly on a motherboard or host system platform (e.g., a PCB (printed circuit board) on which processor 910 is disposed) of a computing device. In one example, memory devices 940 can be organized into memory modules 970. In one example, memory modules 970 represent dual inline memory modules (DIMMs). In one example, memory modules 970 represent other organization of multiple memory devices to share at least a portion of access or control circuitry, which can be a separate circuit, a separate device, or a separate board from the host system platform. Memory modules 970 can include multiple memory devices 940, and the memory modules can include support for multiple separate channels to the included memory devices disposed on them. In another example, memory devices 940 may be incorporated into the same package as memory controller 920, such as by techniques such as multi-chip-module (MCM), package-on-package, through-silicon via (TSV), or other techniques or combinations. Similarly, in one example, multiple memory devices 940 may be incorporated into memory modules 970, which themselves may be incorporated into the same package as memory controller 920. It will be appreciated that for these and other implementations, memory controller 920 may be part of host processor 910.

Memory devices 940 each include memory resources 960. Memory resources 960 represent individual arrays of memory locations or storage locations for data. Typically memory resources 960 are managed as rows of data, accessed via wordline (rows) and bitline (individual bits within a row) control. Memory resources 960 can be organized as separate channels, ranks, and banks of memory. Channels may refer to independent control paths to storage locations within memory devices 940. Ranks may refer to common locations across multiple memory devices (e.g., same row addresses within different devices). Banks may refer to arrays of memory locations within a memory device 940. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 940 include one or more registers 944. Register 944 represents one or more storage devices or storage locations that provide configuration or settings for the operation of the memory device. In one example, register 944 can provide a storage location for memory device 940 to store data for access by memory controller 920 as part of a control or management operation. In one example, register 944 includes one or more Mode Registers. In one example, register 944 includes one or more multipurpose registers. The configuration of locations within register 944 can configure memory device 940 to operate in different "modes," where command information can trigger different operations within memory device 940 based on the mode. Additionally or in the alternative, different modes can also trigger different operation from address information or other signal lines depending on the mode. Settings of register 944 can indicate configuration for I/O settings (e.g., timing, termination or ODT (on-die termination) 946, driver configuration, or other I/O settings).

In one example, memory device 940 includes ODT 946 as part of the interface hardware associated with I/O 942. ODT 946 can be configured as mentioned above, and provide settings for impedance to be applied to the interface to specified signal lines. In one example, ODT 946 is applied to DQ signal lines. In one example, ODT 946 is applied to command signal lines. In one example, ODT 946 is applied to address signal lines. In one example, ODT 946 can be applied to any combination of the preceding. The ODT settings can be changed based on whether a memory device is a selected target of an access operation or a non-target device. ODT 946 settings can affect the timing and reflections of signaling on the terminated lines. Careful control over ODT 946 can enable higher-speed operation with improved matching of applied impedance and loading. ODT 946 can be applied to specific signal lines of I/O interface 942, 922, and is not necessarily applied to all signal lines.

Memory device 940 includes controller 950, which represents control logic within the memory device to control internal operations within the memory device. For example, controller 950 decodes commands sent by memory controller 920 and generates internal operations to execute or satisfy the commands. Controller 950 can be referred to as an internal controller, and is separate from memory controller 920 of the host. Controller 950 can determine what mode is selected based on register 944, and configure the internal execution of operations for access to memory resources 960 or other operations based on the selected mode. Controller 950 generates control signals to control the routing of bits within memory device 940 to provide a proper interface for the selected mode and direct a command to the proper memory locations or addresses. Controller 950 includes command logic 952, which can decode command encoding received on command and address signal lines. Thus, command logic 952 can be or include a command decoder. With command logic 952, memory device can identify commands and generate internal operations to execute requested commands.

Referring again to memory controller 920, memory controller 920 includes command (CMD) logic 924, which represents logic or circuitry to generate commands to send to memory devices 940. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 940, memory controller 920 can issue commands via I/O 922 to cause memory device 940 to execute the commands. In one example, controller 950 of memory device 940 receives and decodes command and address information received via I/O 942 from memory controller 920. Based on the received command and address information, controller 950 can control the timing of operations of the logic and circuitry within memory device 940 to execute the commands. Controller 950 is responsible for compliance with standards or specifications within memory device 940, such as timing and signaling requirements. Memory controller 920 can implement compliance with standards or specifications by access scheduling and control.

Memory controller 920 includes scheduler 930, which represents logic or circuitry to generate and order transactions to send to memory device 940. From one perspective, the primary function of memory controller 920 could be said to schedule memory access and other transactions to memory device 940. Such scheduling can include generating the transactions themselves to implement the requests for data by processor 910 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 920 typically includes logic such as scheduler 930 to allow selection and ordering of transactions to improve performance of system 900. Thus, memory controller 920 can select which of the outstanding transactions should be sent to memory device 940 in which order, which is typically achieved with logic much more complex that a simple first-in first-out algorithm. Memory controller 920 manages the transmission of the transactions to memory device 940, and manages the timing associated with the transaction. In one example, transactions have deterministic timing, which can be managed by memory controller 920 and used in determining how to schedule the transactions with scheduler 930.

In one example, memory controller 920 includes refresh (REF) logic 926. Refresh logic 926 can be used for memory resources that are volatile and need to be refreshed to retain a deterministic state. In one example, refresh logic 926 indicates a location for refresh, and a type of refresh to perform. Refresh logic 926 can trigger self-refresh within memory device 940, or execute external refreshes which can be referred to as auto refresh commands) by sending refresh commands, or a combination. In one example, system 900 supports all bank refreshes as well as per bank refreshes. All bank refreshes cause the refreshing of banks within all memory devices 940 coupled in parallel. Per bank refreshes cause the refreshing of a specified bank within a specified memory device 940. In one example, controller 950 within memory device 940 includes refresh logic 954 to apply refresh within memory device 940. In one example, refresh logic 954 generates internal operations to perform refresh in accordance with an external refresh received from memory controller 920. Refresh logic 954 can determine if a refresh is directed to memory device 940, and what memory resources 960 to refresh in response to the command.

Figure 10:
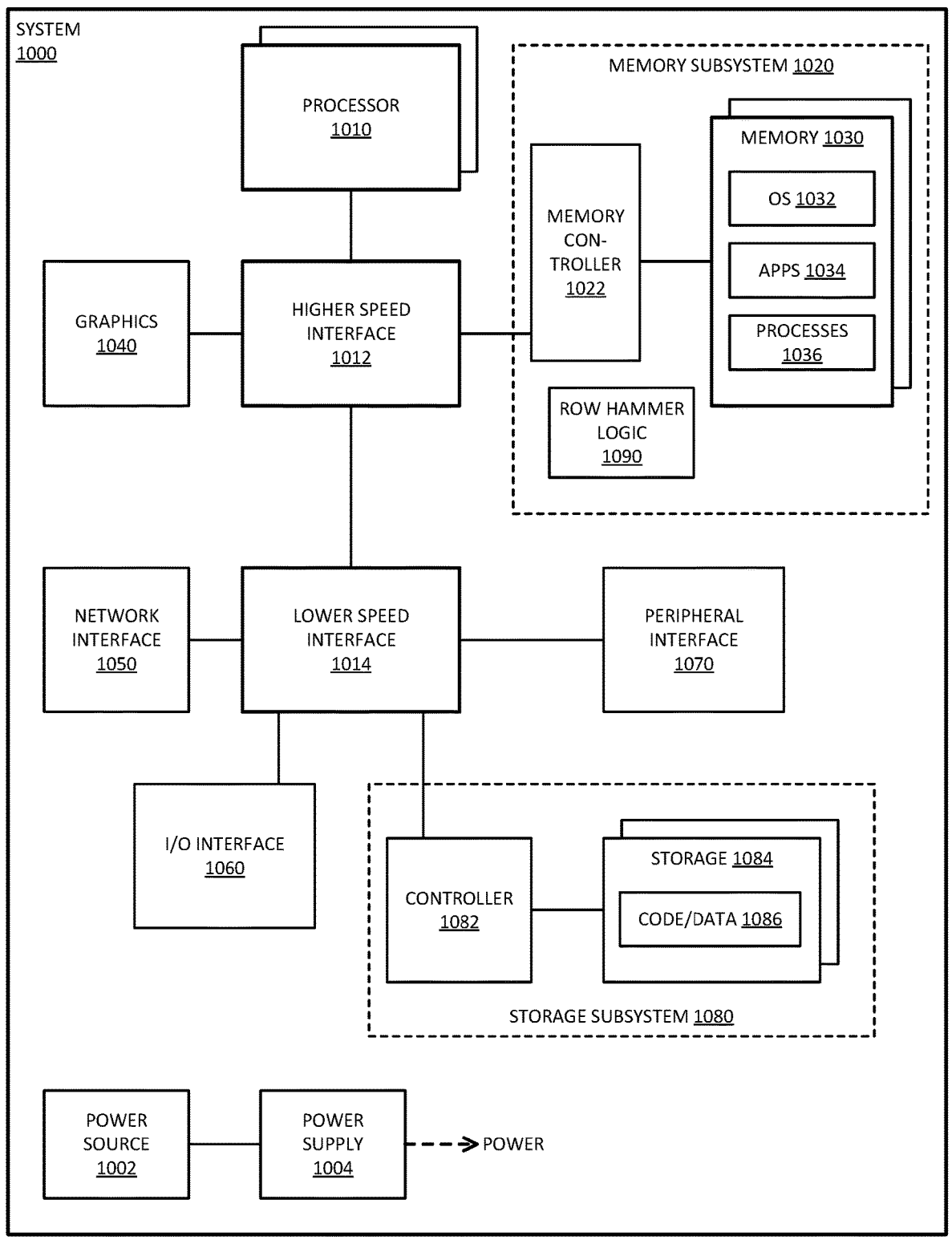
FIG. 10 is a block diagram of an example of a computing system in which a memory system with row hammer mitigation randomization can be implemented.

FIG. 10 is a block diagram of an example of a computing system in which a memory system with row hammer mitigation randomization can be implemented. System 1000 represents a computing device in accordance with any example herein, and can be a laptop computer, a desktop computer, a tablet computer, a server, a gaming or entertainment control system, embedded computing device, or other electronic device.

In one example, memory subsystem 1020 includes row hammer logic 1090 in memory devices 1030. Row hammer logic 1090 row hammer logic in accordance with any description provided herein. Row hammer logic 1090 enables the memory device to perform randomization of selection of a row to refresh for row hammer mitigation. Based on receipt of activate commands, the randomization logic randomly selects from among row hammer candidates, and refreshes one or more victim rows associated with the target row selected. The randomization selection can be performed in accordance with any description provided herein.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1002 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
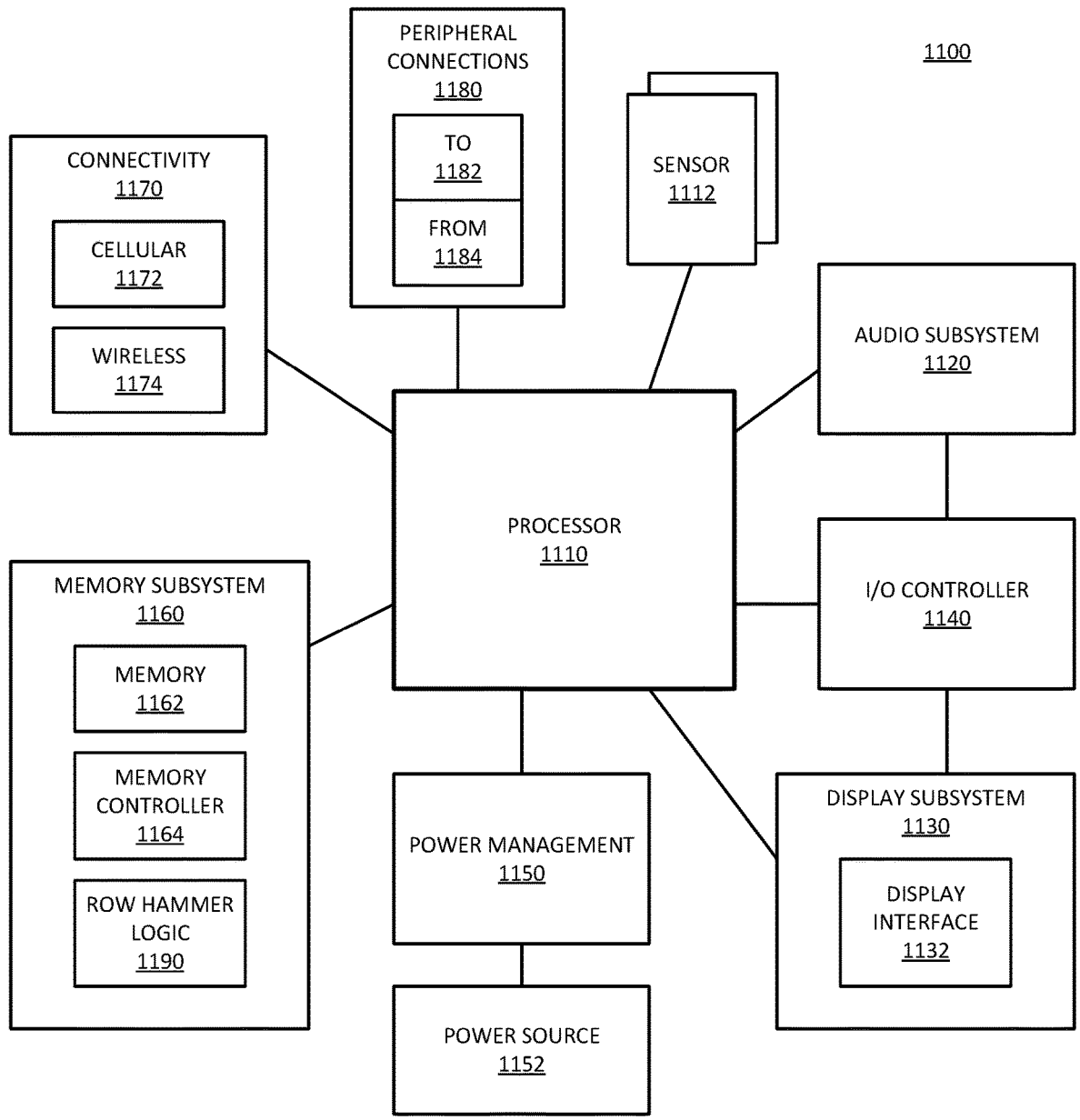
FIG. 11 is a block diagram of an example of a mobile device in which a memory system with row hammer mitigation randomization can be implemented.

FIG. 11 is a block diagram of an example of a mobile device in which a memory system with row hammer mitigation randomization can be implemented. Device 1100 represents a mobile computing device, such as a computing tablet, a mobile phone or smartphone, wearable computing device, or other mobile device, or an embedded computing device. It will be understood that certain of the components are shown generally, and not all components of such a device are shown in device 1100.

In one example, memory subsystem 1160 includes row hammer logic 1190 in memory devices 1162. Row hammer logic 1190 row hammer logic in accordance with any description provided herein. Row hammer logic 1190 enables the memory device to perform randomization of selection of a row to refresh for row hammer mitigation. Based on receipt of activate commands, the randomization logic randomly selects from among row hammer candidates, and refreshes one or more victim rows associated with the target row selected. The randomization selection can be performed in accordance with any description provided herein.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting device 1100 to another device, or a combination. The processing operations can also include operations related to audio I/O, display I/O, or other interfacing, or a combination. Processor 1110 can execute data stored in memory. Processor 1110 can write or edit data stored in memory.

In one example, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one example, one or more sensors 1112 couples to processor 1110 via a frontend circuit integrated with processor 1110. In one example, one or more sensors 1112 couples to processor 1110 via another component of system 1100.

In one example, device 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1100, or connected to device 1100. In one example, a user interacts with device 1100 by providing audio commands that are received and processed by processor 1110.

Display subsystem 1130 represents hardware (e.g., display devices) and software components (e.g., drivers) that provide a visual display for presentation to a user. In one example, the display includes tactile components or touchscreen elements for a user to interact with the computing device. Display subsystem 1130 includes display interface 1132, which includes the particular screen or hardware device used to provide a display to a user. In one example, display interface 1132 includes logic separate from processor 1110 (such as a graphics processor) to perform at least some processing related to the display. In one example, display subsystem 1130 includes a touchscreen device that provides both output and input to a user. In one example, display subsystem 1130 includes a high definition (HD) or ultra-high definition (UHD) display that provides an output to a user. In one example, display subsystem includes or drives a touchscreen display. In one example, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one example, I/O controller 1140 manages devices such as accelerometers, cameras, light sensors or other environmental sensors, gyroscopes, global positioning system (GPS), or other hardware that can be included in device 1100, or sensors 1112. The input can be part of direct user interaction, as well as providing environmental input to the system to influence its operations (such as filtering for noise, adjusting displays for brightness detection, applying a flash for a camera, or other features).

In one example, device 1100 includes power management 1150 that manages battery power usage, charging of the battery, and features related to power saving operation. Power management 1150 manages power from power source 1152, which provides power to the components of system 1100. In one example, power source 1152 includes an AC to DC (alternating current to direct current) adapter to plug into a wall outlet. Such AC power can be renewable energy (e.g., solar power, motion based power). In one example, power source 1152 includes only DC power, which can be provided by a DC power source, such as an external AC to DC converter. In one example, power source 1152 includes wireless charging hardware to charge via proximity to a charging field. In one example, power source 1152 can include an internal battery or fuel cell source.

Memory subsystem 1160 includes memory device(s) 1162 for storing information in device 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one example, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable device 1100 to communicate with external devices. The external device could be separate devices, such as other computing devices, wireless access points or base stations, as well as peripherals such as headsets, printers, or other devices. In one example, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading, uploading, changing, synchronizing) content on device 1100. Additionally, a docking connector can allow device 1100 to connect to certain peripherals that allow device 1100 to control content output, for example, to audiovisual or other systems.

In addition to a proprietary docking connector or other proprietary connection hardware, device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a dynamic random access memory (DRAM) device includes: a register to store a value for the DRAM device, the value unique with respect to other memory devices that share a data bus with the DRAM device; a memory array having multiple rows of memory; and control logic to perform row hammer mitigation in response to an external refresh command from a memory controller to refresh a victim row out of order from a refresh counter, wherein the row hammer mitigation includes the control logic to select the victim row corresponding to a target row identified by a recent activate command, wherein to select includes the control logic to perform a pseudo-random computation based on the value to select the victim row.

In one example, the value comprises a unique identifier for the DRAM device. In one example, the unique identifier comprises a per device addressability (PDA) enumeration value. In one example, the unique identifier comprises a DRAM identifier assigned by a memory module register device. In one example, the register comprises a mode register for the DRAM device. In one example, the DRAM device further comprising multiple counters to track recent activates for multiple rows within a refresh period, wherein the control logic is to select from among the multiple rows with highest activate counts. In one example, the DRAM device further comprising a row hammer register to store a selected row address of a recently-activated row based on a total number of activates to the memory array within a refresh period adjusted by the pseudo-random computation. In one example, the DRAM device further comprising a linear feedback shift register (LFSR) to generate a pseudo random number based on the value as a seed value.

In general with respect to the descriptions herein, in one example, a system includes: a memory controller; and multiple dynamic random access memory (DRAM) devices coupled to the memory controller, wherein a given DRAM device is in accordance with any example of the preceding paragraphs. In one example, the system further comprising one or more of: a host processor device coupled to the memory controller; a display communicatively coupled to a host processor; a network interface communicatively coupled to a host processor; or a battery to power the computing device.

In general with respect to the descriptions herein, in one example, a memory controller includes: an input/output (I/O) interface to couple to multiple dynamic random access memory (DRAM) devices; and command logic to generate commands to store values in the multiple DRAM devices, the values unique with respect to each other, the command logic to send an external refresh command; wherein in response to the external refresh command the DRAM devices are to perform row hammer mitigation to refresh a victim row out of order from a refresh counter, wherein the row hammer mitigation includes selection of the victim row corresponding to a target row identified by a recent activate command, including a pseudo-random computation based on the value to cause the DRAM devices to select different victim rows.

In one example, the values comprise unique identifiers for the DRAM devices. In one example, the unique identifiers comprise per device addressability (PDA) enumeration values. In one example, the values comprise values the command logic is to write to mode registers of the DRAM devices.

In general with respect to the descriptions herein, in one example, a system includes: a memory controller; and multiple dynamic random access memory (DRAM) devices; and a memory controller coupled to the multiple DRAM devices, wherein the memory controller is in accordance with any example of the preceding paragraphs. In one example, the system further comprising one or more of: a host processor device coupled to the memory controller; a display communicatively coupled to a host processor; a network interface communicatively coupled to a host processor; or a battery to power the computing device.

In general with respect to the descriptions herein, in one example, a method includes: storing a value for a DRAM device in a register, the value unique with respect to other memory devices that share a data bus with the DRAM device; receiving an external refresh command from a memory controller; performing row hammer mitigation a memory array having multiple rows of memory in response to receiving the external refresh command to refresh a victim row out of order from a refresh counter, wherein the row hammer mitigation includes the control logic to select the victim row corresponding to a target row identified by a recent activate command, including performing a pseudo-random computation based on the value to select the victim row.

In one example, the value comprises a unique identifier for the DRAM device. In one example, the unique identifier comprises a per device addressability (PDA) enumeration value. In one example, the unique identifier comprises a DRAM identifier assigned by a memory module register device. In one example, the register comprises a mode register for the DRAM device. In one example, the method further comprising tracking with a counter recent activates for multiple rows within a refresh period, including selecting from among the multiple rows with highest activate counts. In one example, performing row hammer mitigation comprises storing a selected row address of a recently-activated row based on a total number of activates to the memory array within a refresh period adjusted by the pseudo-random computation. In one example, performing row hammer mitigation comprises generating with a linear feedback shift register (LFSR) a pseudo random number based on the value as a seed value.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device, comprising:
 a register to store a value for the DRAM device, the value unique with respect to other memory devices that share a data bus with the DRAM device;
 a memory array having multiple rows of memory; and
 control logic to perform row hammer mitigation in response to an external refresh command from a memory controller to refresh a victim row out of order from a refresh counter, wherein the row hammer mitigation includes the control logic to select the victim row corresponding to a target row identified by a recent activate command, wherein to select includes the control logic to perform a pseudo-random computation based on the value to select the victim row.

2. The DRAM device of claim 1, wherein the value comprises a unique identifier for the DRAM device.

3. The DRAM device of claim 2, wherein the unique identifier comprises a per device addressability (PDA) enumeration value.

4. The DRAM device of claim 2, wherein the unique identifier comprises a DRAM identifier assigned by a memory module register device.

5. The DRAM device of claim 1, wherein the register comprises a mode register for the DRAM device.

6. The DRAM device of claim 1, further comprising multiple counters to track recent activates for multiple rows within a refresh period, wherein the control logic is to select from among the multiple rows with highest activate counts.

7. The DRAM device of claim 1, further comprising a row hammer register to store a selected row address of a recently-activated row based on a total number of activates to the memory array within a refresh period adjusted by the pseudo-random computation.

8. The DRAM device of claim 1, further comprising a linear feedback shift register (LFSR) to generate a pseudo random number based on the value as a seed value.

9. A memory controller, comprising:
 an input/output (I/O) interface to couple to multiple dynamic random access memory (DRAM) devices; and
 command logic to generate commands to store values in the multiple DRAM devices, the stored values unique with respect to each other, the command logic to send an external refresh command;
 wherein in response to the external refresh command the DRAM devices are to perform row hammer mitigation to refresh a victim row out of order from a refresh counter, wherein the row hammer mitigation includes selection of the victim row corresponding to a target row identified by a recent activate command, including a pseudo-random computation based on the stored values to cause the DRAM devices to select different victim rows.

10. The memory controller of claim 9, wherein the stored values comprise unique identifiers for the DRAM devices.

11. The memory controller of claim 10, wherein the unique identifiers comprise per device addressability (PDA) enumeration values.

12. The memory controller of claim 9, wherein the stored values comprise values the command logic is to write to mode registers of the DRAM devices.

13. A system, comprising:
 a memory controller; and
 multiple dynamic random access memory (DRAM) devices coupled to the memory controller, wherein a given DRAM device includes
 a register to store a value for the DRAM device, the value unique with respect to other DRAM devices;
 a memory array having multiple rows of memory; and
 control logic to perform row hammer mitigation in response to an external refresh command from the memory controller to refresh a victim row out of order from a refresh counter, wherein the row hammer mitigation includes the control logic to select the victim row corresponding to a target row identified by a recent activate command, wherein to select includes the control logic to perform a pseudo-random computation based on the value to select the victim row.

14. The system of claim 13, wherein the value comprises a unique identifier for the DRAM device.

15. The system of claim 14, wherein the unique identifier comprises a per device addressability (PDA) enumeration value.

16. The system of claim 13, wherein the register comprises a mode register for the DRAM device.

17. The system of claim 13, the DRAM device further comprising multiple counters to track recent activates for multiple rows within a refresh period, wherein the control logic is to select from among the multiple rows with highest activate counts.

18. The system of claim 13, the DRAM device further comprising a row hammer register to store a selected row address of a recently-activated row based on a total number of activates to the memory array within a refresh period adjusted by the pseudo-random computation.

19. The system of claim 13, the DRAM device further comprising a linear feedback shift register (LFSR) to generate a pseudo random number based on the value as a seed value.

20. The system of claim 13, further comprising one or more of:
 a host processor device coupled to the memory controller;
 a display communicatively coupled to a host processor;
 a network interface communicatively coupled to a host processor; or
 a battery to power the system.

* * * * *